(12) United States Patent
Zhu et al.

(10) Patent No.: US 12,165,934 B2
(45) Date of Patent: Dec. 10, 2024

(54) SUBSTRATE PROCESSING MONITORING

(71) Applicant: Applied Materials, Inc., Santa Clara, CA (US)

(72) Inventors: Zuoming Zhu, Sunnyvale, CA (US); Shu-Kwan Lau, Sunnyvale, CA (US); Ala Moradian, Sunnyvale, CA (US); Enle Choo, Saratoga, CA (US); Flora Fong-Song Chang, Saratoga, CA (US); Vilen K Nestorov, Pleasanton, CA (US); Zhiyuan Ye, San Jose, CA (US); Bindusagar Marath Sankarathodi, San Jose, CA (US); Maxim D. Shaposhnikov, Sunnyvale, CA (US); Surendra Singh Srivastava, Santa Clara, CA (US); Zhepeng Cong, Vancouver, WA (US); Patricia M. Liu, Saratoga, CA (US); Errol C. Sanchez, Tracy, CA (US); Jenny C. Lin, Saratoga, CA (US); Schubert S. Chu, San Francisco, CA (US); Balakrishnam R. Jampana, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 149 days.

(21) Appl. No.: 16/938,510

(22) Filed: Jul. 24, 2020

(65) Prior Publication Data
US 2021/0028075 A1 Jan. 28, 2021

Related U.S. Application Data

(60) Provisional application No. 62/903,012, filed on Sep. 20, 2019, provisional application No. 62/879,230, filed on Jul. 26, 2019.

(51) Int. Cl.
*H01L 21/66* (2006.01)
*H01L 21/67* (2006.01)

(52) U.S. Cl.
CPC ........ *H01L 22/26* (2013.01); *H01L 21/67253* (2013.01)

(58) Field of Classification Search
CPC .................... H01L 22/26; H01L 21/67253
See application file for complete search history.

(56) References Cited

U.S. PATENT DOCUMENTS 5,166,080 A 11/1992 Schietinger et al.
6,835,275 B1 * 12/2004 Grimbergen ...... H01J 37/32458
118/712

(Continued)

FOREIGN PATENT DOCUMENTS

JP H09-256155 A 9/1997
KR 20040053203 A 6/2004

(Continued)

OTHER PUBLICATIONS

Office Action from Taiwan Patent Application No. 109125025 dated Jul. 29, 2021.

(Continued)

*Primary Examiner* — Mohammad M Choudhry
(74) *Attorney, Agent, or Firm* — Patterson + Sheridan, LLP (57) ABSTRACT

A method for processing a substrate within a processing chamber comprises receiving a first radiation signal corresponding to a film on a target element disposed within the processing chamber, analyzing the first radiation signal, and controlling the processing of the substrate based on the analyzed first radiation signal. The processing chamber includes a substrate support configured to support the substrate within a processing volume and a controller coupled (Continued)

to a first sensing device configured to receive the first radiation signal.

18 Claims, 7 Drawing Sheets

(56) References Cited

U.S. PATENT DOCUMENTS

| | | | |
|---|---|---|---|
| 10,196,738 B2 | 2/2019 | Lee et al. | |
| 2003/0029382 A1 | 2/2003 | Takahashi et al. | |
| 2013/0034918 A1 | 2/2013 | Dusemund et al. | |
| 2018/0010243 A1* | 1/2018 | Lee | H01L 22/26 |

FOREIGN PATENT DOCUMENTS

| | | |
|---|---|---|
| KR | 20140033376 A | 3/2014 |
| TW | 200717679 A | 5/2007 |
| TW | 201410916 A | 3/2014 |
| TW | 201702426 A | 1/2017 |

OTHER PUBLICATIONS

Office Action from Taiwan Patent Application No. 109125025 dated Apr. 8, 2021.
International Search Report and Written Opinion for PCT/US2020/039782 dated Oct. 12, 2020.
TW Office Action for Taiwan Patent Application No. 109125025 dated Jan. 30, 2024.
KR Office Action dated Mar. 29, 2024, for Korean Patent Application No. 10-2022-7005749.
TW Office Action for Taiwan Patent Application No. 113202013 dated Mar. 18, 2024.
TW Office Action for Taiwan Patent Application No. 110135944 dated Sep. 26, 2023.
TW Office Action for Taiwan Patent Application No. 109125025 dated Sep. 26, 2023.

* cited by examiner

SUBSTRATE PROCESSING MONITORING

CROSS REFERENCE TO RELATED APPLICATIONS

This application claims the benefit of U.S. provisional patent application Ser. No. 62/879,230, filed Jul. 26, 2019, and U.S. provisional patent application Ser. No. 62/903,012, filed Sep. 20, 2019, which are hereby incorporated herein by reference in their entirety.

BACKGROUND

Field

The embodiments of the present disclosure generally relate to monitoring processing chambers, and specifically to a sensing device configured to monitor films during substrate processing within a processing chamber.

Description of the Related Art

Semiconductor devices are generated by forming one or more films on a substrate or etching films formed on substrate. However, during processing, variations within process parameters (e.g., temperature, pressure, and processing gas flow) may result in a variation in the thickness of and/or the profile of a film on a substrate. The variations may result in one or more artifacts within the films and failures within the semiconductor devices. Accordingly, the corresponding substrates must be discarded, resulting in decreased production yield and increased manufacturing costs. Further, in many processing chambers, it is not possible to monitor the thickness of a film on a substrate.

Thus, there remains a need in the art for an improved system and method to monitor the thickness of a film on a substrate.

SUMMARY

In one embodiment, a method for processing a substrate within a processing chamber comprises receiving a first radiation signal corresponding to a film on a target element disposed within the processing chamber, analyzing the first radiation signal, and controlling the processing of the substrate based on the analyzed first radiation signal.

In one embodiment, processing chamber comprises a substrate support, a first sensing device, and a controller. The substrate support is configured to support a substrate within a processing volume of the processing chamber. The first sensing device is configured to receive a first radiation signal corresponding to a film on a target element disposed within the processing volume while processing the substrate. The controller is configured to analyze the first radiation signal control the processing of the substrate based on the analyzed first radiation signal.

In one embodiment, a controller for a processing chamber is configured to receive a first radiation signal with a sensing device while processing a substrate. The first radiation signal corresponds to a film on a target element disposed within the processing chamber. The controller is further configured to analyze the first radiation signal and control the processing of the substrate based on the analyzed first radiation signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Semiconductor devices can be generated by forming one or more films on a substrate or etching films on a substrate. During processing, variations within process parameters (e.g., temperature, pressure, and precursor flow) may result in a variation in the thickness of and/or profile of a film. Further, any non-uniformity of the films may result in a drop in production yield, increasing the manufacturing costs of semiconductor devices.

Using the systems and methods discussed herein, variations within a thickness of a film and/or variations within a profile of a film may be mitigated. Variations within a thickness and/or profile of a film may be mitigated, for example, by monitoring the thickness of the film during deposition and adjusting the process to ensure the thickness of the film is within a threshold range.

Figure 1:
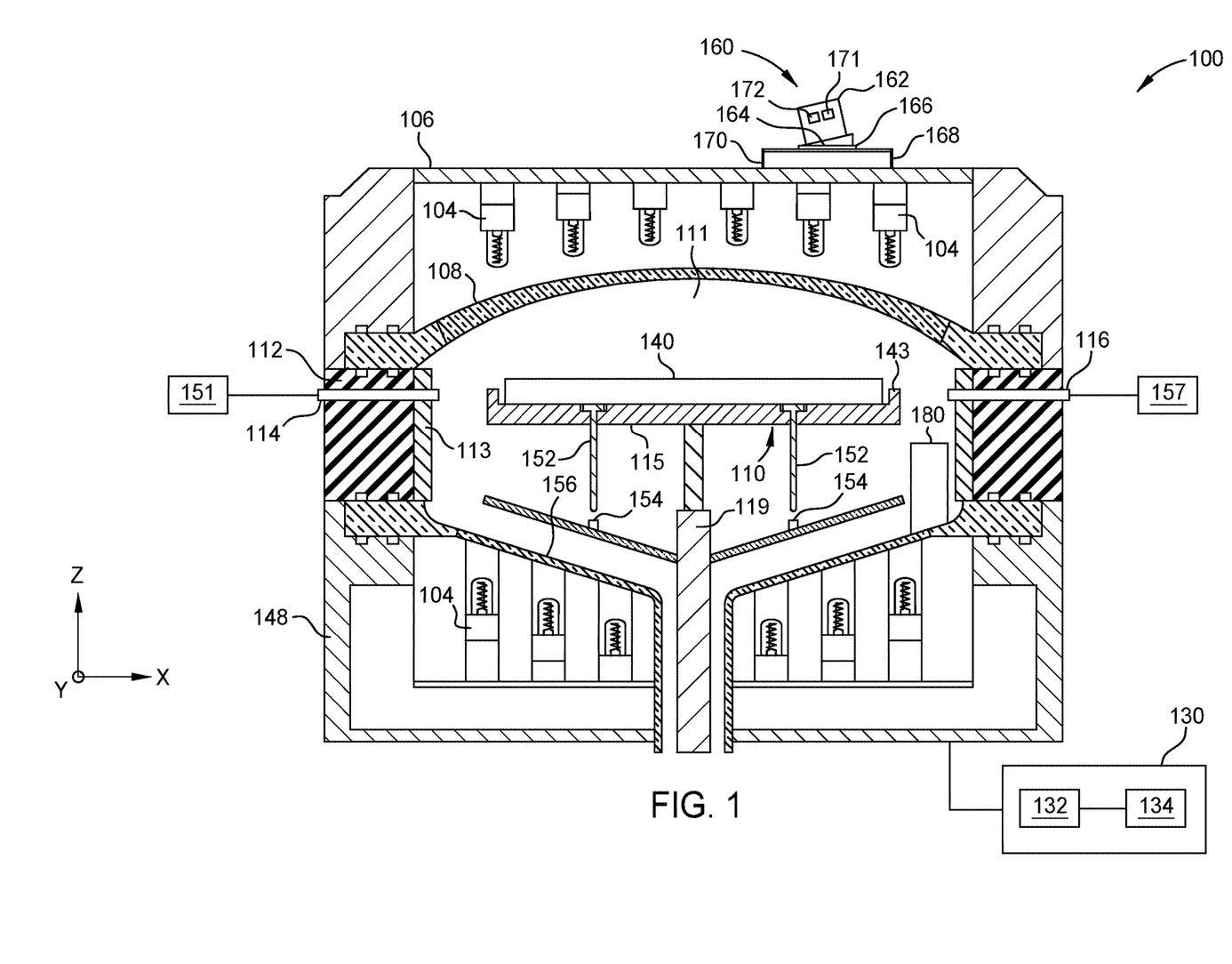
FIGS. 1 and 2 are schematic cross-sectional views of a processing chamber, according to one or more embodiments.

FIG. 1 illustrates a schematic sectional view of a processing chamber 100 according to one embodiment. The processing chamber 100 may be used to process one or more substrates therein, including the processes of depositing a material on a substrate 140, heating of the substrate 140, etching of the substrate 140, or combinations thereof. The processing chamber 100 generally includes a chamber wall 148, and an array of radiant heating lamps 104 for heating, among other components, a susceptor 110 disposed within the processing chamber 100.

The radiant heating lamps 104 heat the susceptor 110 and the substrate 140 as a process gas or vapor passes over the surface of the substrate 140, facilitating the deposition of a material onto the device side of the substrate 140. As shown in FIG. 1, an array of radiant heating lamps 104 may be disposed below and/or above the susceptor 110.

The susceptor 110 comprises a substrate support 115 and is located within the processing chamber 100 between energy transmissive member 108, which may be a dome or any other shape, and energy transmissive member 156, which may also be a dome or any other shape. The energy transmissive member 108 and the energy transmissive member 156, along with a body 112 that is disposed between the energy transmissive member 108 and energy transmissive member 156, generally define a processing volume 111 of the processing chamber 100. The energy transmissive member 108 and/or the energy transmissive member 156 may be optically transparent to the high-energy radiant radiation (transmitting at least 95% of the radiation of the high-energy radiant radiation). Further, the energy transmissive member 108 and the energy transmissive member 156 may be fabricated from quartz. Additionally, the array of radiant heating lamps 104 may be disposed above the energy transmissive member 108.

The radiant heating lamps 104 are configured to heat the substrate 140. For example, the heating lamps 104 may heat the substrate 140 to a temperature within a range of about 200 degrees Celsius to about 1,600 degrees Celsius. Each heating lamp 104 can be coupled to a power distribution board through which power is supplied to each heating lamp 104. The radiant heating lamps 104 are positioned within a housing which is configured to be cooled during or after processing by, for example, using a cooling fluid introduced into channels located between the radiant heating lamps 104.

The substrate 140 is transferred into the processing chamber 100 and positioned onto the susceptor 110 through a loading port (not shown) formed in the body 112. A process gas inlet 114 and a gas outlet 116 are provided in the body 112.

A robot (not shown) enters the processing chamber 100 to engage at least the underside of the substrate 140 and remove the substrate 140 therefrom though the loading port. A new substrate may then be loaded onto the lift pins 152 by the robot, and the susceptor 110 may then be actuated up to receive the substrate 140. The susceptor 110 may remain stationary while the lift pins 152 are raised and lowered such that the lift pins 152 are able to engage the substrate 140. Further, after a new substrate is placed on the lift pins 152, the lift pins 152 are lowered while the susceptor 110 remains stationary and engage stops 154. The lift pins 152 may include an enlarged head allowing the lift pins 152 to be suspended in openings in the susceptor 110 when in the processing position. The susceptor 110, while located in the processing position, divides the internal volume of the processing chamber 100 into a process gas region above the susceptor 110, and a purge gas region below the susceptor 110.

Substrate temperature is measured by sensors configured to measure temperatures at the bottom of the susceptor 110. The sensors may be pyrometers (not shown) disposed in ports formed in the housing of the processing chamber (e.g., the processing chamber 100).

Process gas supplied from a process gas supply source 151 is introduced into a process gas region through the process gas inlet 114 formed in the sidewall of the body 112. The process gas inlet 114 is configured to direct the process gas in a generally radially inward direction. As such, in some embodiments, the process gas inlet 114 is a side gas injector. The side gas injector is positioned to direct the process gas across a surface of the susceptor 110 and/or the substrate 140. During a film formation process for forming a film layer of the substrate 140, the susceptor 110 is located in the processing position, which is adjacent to and at about the same elevation as the process gas inlet 114. Thus the process gas flows generally across the upper surface of the susceptor 110 and/or the substrate 140. The process gas exits the process gas region through the gas outlet 116 located on the opposite side of the processing chamber 100 from the process gas inlet 114. Removal of the process gas through the gas outlet 116 here is facilitated by a vacuum pump 157 coupled thereto.

The above-described processing chamber 100 can be controlled by a processor based system controller, such as controller 130. For example, the controller 130 is configured to control flow of various precursor and process gases and purge gases from gas sources, during different operations of a substrate processing sequence. By way of further example, the controller 130 is configured to control a firing of a spot heating module, feeding of gases, lamp operation, or other process parameters, among other controller operations.

The processing chamber 100 further includes a sensing device 160. The sensing device 160 may be mounted to a lid assembly 106 of the processing chamber 100. Alternatively, the sensing device 160 may be mounted to an element external to the processing chamber 100. Further, the sensing device 160 may receive sensor data corresponding to the thermal radiation of a film on a target element (e.g., the target element 310 of FIG. 3). The sensing device 160 may determine a thickness of the film from the sensor data or communicate the sensor data to a controller 130 and the controller 130 determines the thickness of the film from the sensor data.

The target element may be at least a portion of the surface 143 of the susceptor 110. The target element may be any portion of the surface 143 that is not covered by the substrate 140 during processing. For example, the target element may be the surface 143 of an edge region of the susceptor 110. Alternatively, the target element may be a portion of a liner 113 of an inner surface of the processing chamber 100. Alternatively, or additionally, the target element may be processing chamber element 180. The processing chamber element 180 may be an additional element of the processing chamber 100 for material to be deposited onto or removed from during processing of the substrate 140. For example, the processing chamber element 180 and the film disposed on the processing chamber element 180 may function as a control element during processing of the substrate 140.

During a deposition process, as material is deposited onto the substrate 140 to form a film, the material is also deposited on a target element. For example, during a deposition process, as material is deposited onto the substrate 140 to form a film, the material is also deposited on a target element (e.g., the surface 143 of the susceptor 110, the liner 113 or the processing chamber element 180). Further, during an etch process, as material is removed from the substrate 140 to alter the thickness of a film on the substrate 140, the material is also removed from a film formed on a target element. For example, during an etching process, as material is removed from the substrate 140, the material is also removed from a filmed formed on one of the surface 143 of the susceptor 110, the liner 113 and the processing chamber element 180 at a corresponding rate. Thus, the thickness of the film on the target element corresponds to the thickness of the film on the substrate 140. Accordingly, monitoring the thickness of the film on the target element allows for the monitoring the thickness of the film on the substrate 140.

The sensing device 160 includes a sensor 162, an angled mounting element 164, a mounting block 166, a mounting plate 168, and a reflector 170. The sensor 162 may be a radiation thermometer, an emissivity sensor, or a pyrometer, among others. For example, the sensor 162 may be a radiation thermometer and the sensor data corresponds to a thermal radiation intensity of a film deposited on the target.

The angled mounting element 164, the mounting block 166, the mounting plate 168, and the reflector 170 may each be independent elements. Alternatively, two or more of the angled mounting element 164, the mounting block 166, the mounting plate 168, and the reflector 170 may be combined into a single element. For example, the angled mounting element 164 may be part of the mounting block 166. Further, the reflector 170 may be part of the mounting plate 168. Additionally, or alternatively, the mounting block 166 may be part of the mounting plate 168.

One or more of the angled mounting element 164, the mounting block 166, the mounting plate 168, and the reflector 170 may be omitted. For example, the mounting block 166 may be omitted and the angled mounting element 164 may be mounted directly to the mounting plate 168.

The sensor 162 is mounted on the angled mounting element 164 such that the sensor 162 is mounted at an angle relative to a surface of the target element. For example, the sensor 162 may be mounted at an angle of about 0 degrees to about 90 degrees relative to the target element. In other embodiments, the sensor 162 may be mounted at angles greater than about 90 degrees relative to the target element.

As shown, the sensor 162 includes an optical system 171 and detector 172. The optical system 171 may include one or more a lenses that focuses the energy within the radiation signals emitted by the film on the target element onto the detector 172. The detector 172 is sensitive to the radiation and generates sensor data corresponding to the radiation within the thermal radiation signal. The radiation signals may be thermal radiation signals. Alternatively, other detectors may detect other types of radiation signals. The detector 172 may be responsive to various wavelengths of light. For example, in infrared embodiments, the detector 172 may be responsive to energy radiated from a target element in a wavelength range of about 700 nm to about 5000 nm. Alternatively, the detector 172 may be responsive to energy radiated from a target element in a wavelength less than about 700 nm or greater than about 5000 nm.

The sensor data generated by the detector 172 may be proportional to the amount of energy radiated by the target element. The sensor data may be processed to determine or infer the temperature of the target element.

The mounting plate 168 may be used to mount the sensing device 160 to the lid assembly 106 or another element such that the sensing device 160 is able to receive radiation signals from a target element within the processing chamber 100. The reflector 170 includes a reflective inner surface and directs radiation signals on the sensor 162. As is stated above, the reflector 170 may be part of the mounting plate 168.

The controller 130 is coupled to the processing chamber 100. The controller 130 includes a central processing unit (CPU) 132, a memory 134, and support circuits. Further, the controller 130 may be part of a server and positioned remotely from the processing chamber 100. For example, the controller 130 may be part of a server that is connected to the processing chamber 100 through a wide area network (WAN) or a local area network (LAN).

The controller 130 is utilized to control the operation of the processing chamber 100. For example, the controller 130 may control the operation of the gas supply source 151, the vacuum pump 157, and the heating lamps 104

The CPU 132 may be of any form of a general purpose computer processor that can be used in an industrial setting.

The software routines can be stored in the memory 134, such as random access memory, read only memory, floppy or hard disk drive, or other form of digital storage. The support circuits are coupled to the CPU 132 and may comprise cache, clock circuits, input/output subsystems, power supplies, and the like. The software routines, when executed by the CPU 132, transform the CPU 132 into a specific purpose computer (controller) 130 that controls the processing chamber 100 such that the processes are performed in accordance with the present disclosure. The software routines may also be stored and/or executed by a second controller (not shown) that is located remotely from the chamber.

Figure 2:
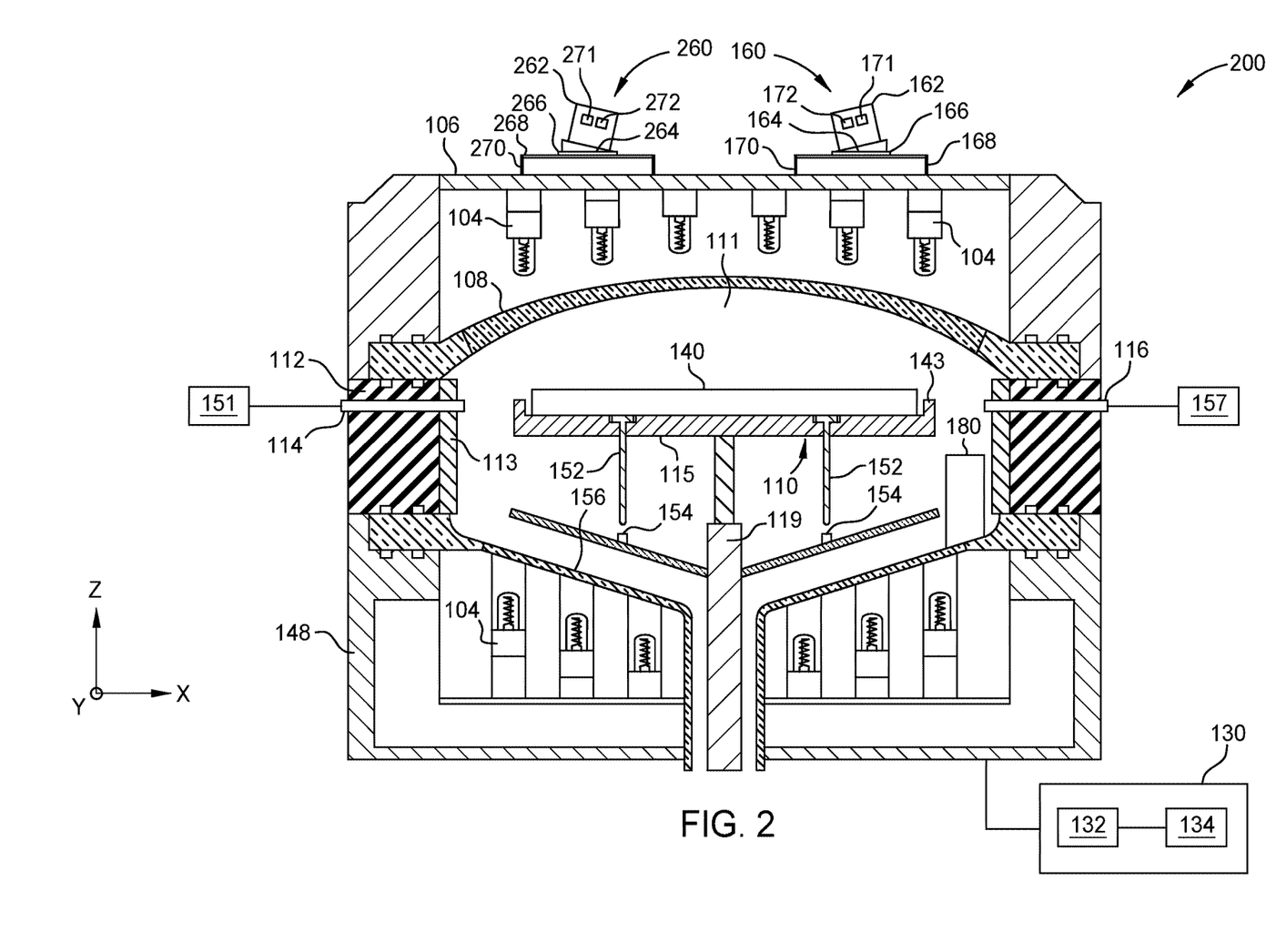

FIG. 2 illustrates a schematic cross-sectional view of a processing chamber 200 according to one or more embodiments. The processing chamber 200 is configured similar to that of the processing chamber 100. However, the processing chamber 200 includes two sensing devices (e.g., the sensing device 160 and the sensing device 260). The sensing device 260 is configured similar to that of the sensing device 160. For example, the sensing device includes a sensor 262, an angled mounting element 264, a mounting block 266, a mounting plate 268, and a reflector 270. The sensor 262 may be a radiation thermometer, an emissivity sensor, or a pyrometer, among others. The sensor may include an optical system 271 and detector 272. Further, the sensor 262 and the sensor 162 may the same type or different types. For example, the sensors 162 and 262 may be a radiation thermometer. Alternatively, the sensor 162 may be a radiation thermometer and the sensor 262 may be an emissivity sensor.

The sensor 162 is mounted at a first angle and the sensor 262 is mounted at a second angle. The first angle may be greater than, less than, or the same as the second angle. Further, the sensor 162 may receive a radiation signal that may be utilized to measure the thermal radiation of a first target element and the sensor 262 may measure the thermal radiation from a second target element different than the first target element. For example, the sensor 162 may receive a radiation signal that may be used to measure the thermal radiation of a film on the surface 143 of the susceptor 110 and the sensor 262 may receive a radiation signal that may be used to measure the thermal radiation of a film on a liner 113 of the chamber wall 148. Alternatively, the sensor 162 and the sensor 262 may receive radiation signals that may be utilized to measure the thermal radiation of a first target element. For example, the sensor 162 and the sensor 262 may receive radiation signals that may be utilized to measure the thermal radiation of the surface 143 of the susceptor 110.

Figure 3:
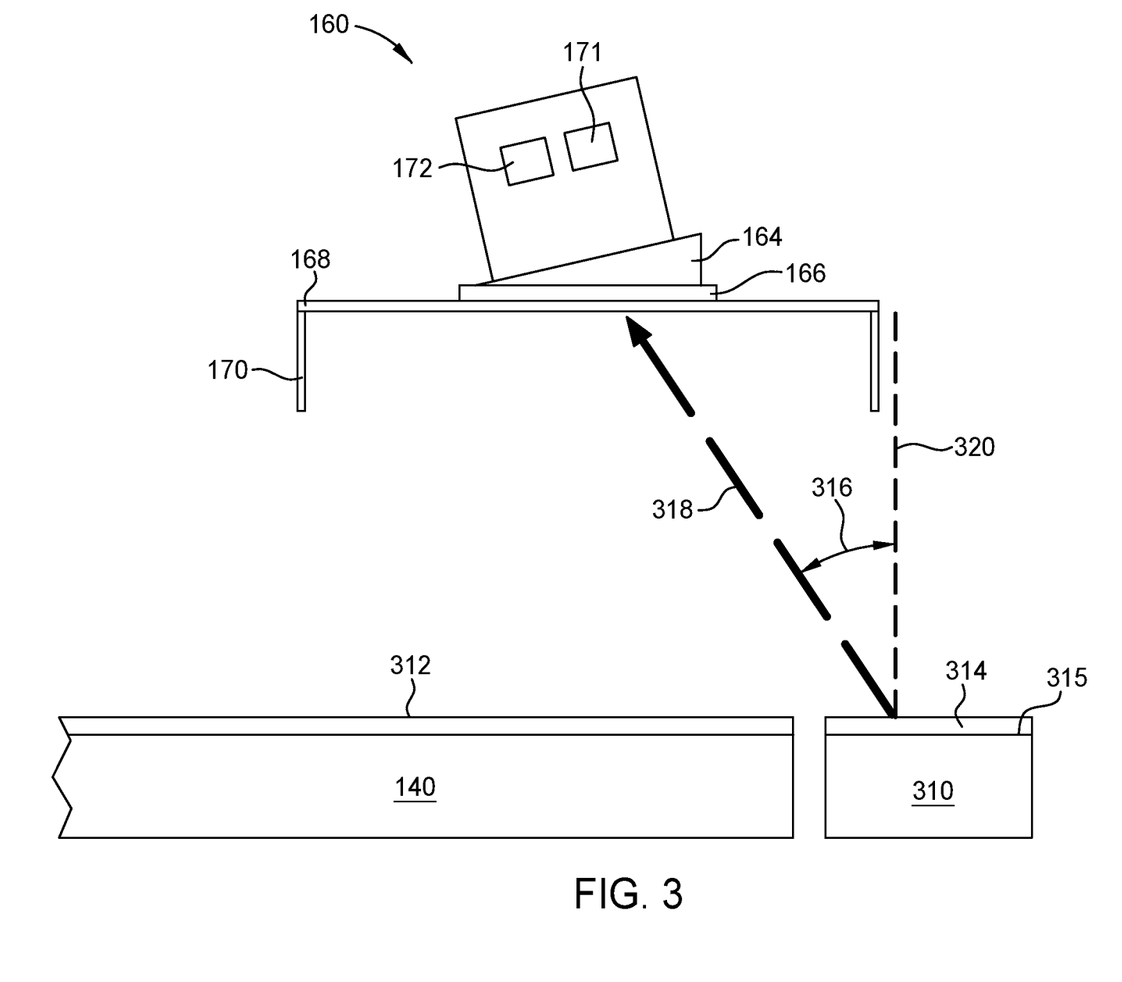
FIG. 3 illustrates a portion of a processing chamber, according to one or more embodiments.

FIG. 3 illustrates a portion of a processing chamber (e.g., the processing chamber 100 or 200), according to one or more embodiments. For example, as illustrated, the sensing device 160 receives a radiation signal 318 from a film deposited on the target element 310. The target element 310 may be one of the surface 143 of the susceptor 110, the liner 113 and/or the processing chamber element 180. Alternatively, the target element 310 may be an inner surface of a chamber wall of a processing chamber, a showerhead of a processing chamber, or a substrate support ring of a processing chamber, among others. Further, the target element 310 may be an element other the substrate within the processing volume 111 on which a film may be deposited or a film may be etched.

The radiation signal 318 received by the sensing device 160 may be at an angle 316. The radiation signal 318 may be a thermal radiation signal. The angle 316 may be about 0 degrees to about 90 degrees relative to line 320 perpendicular to a surface 315 of the target element 310. Alternatively, angles of larger than about 90 degrees relative to the line 320 may be utilized.

Figure 4:
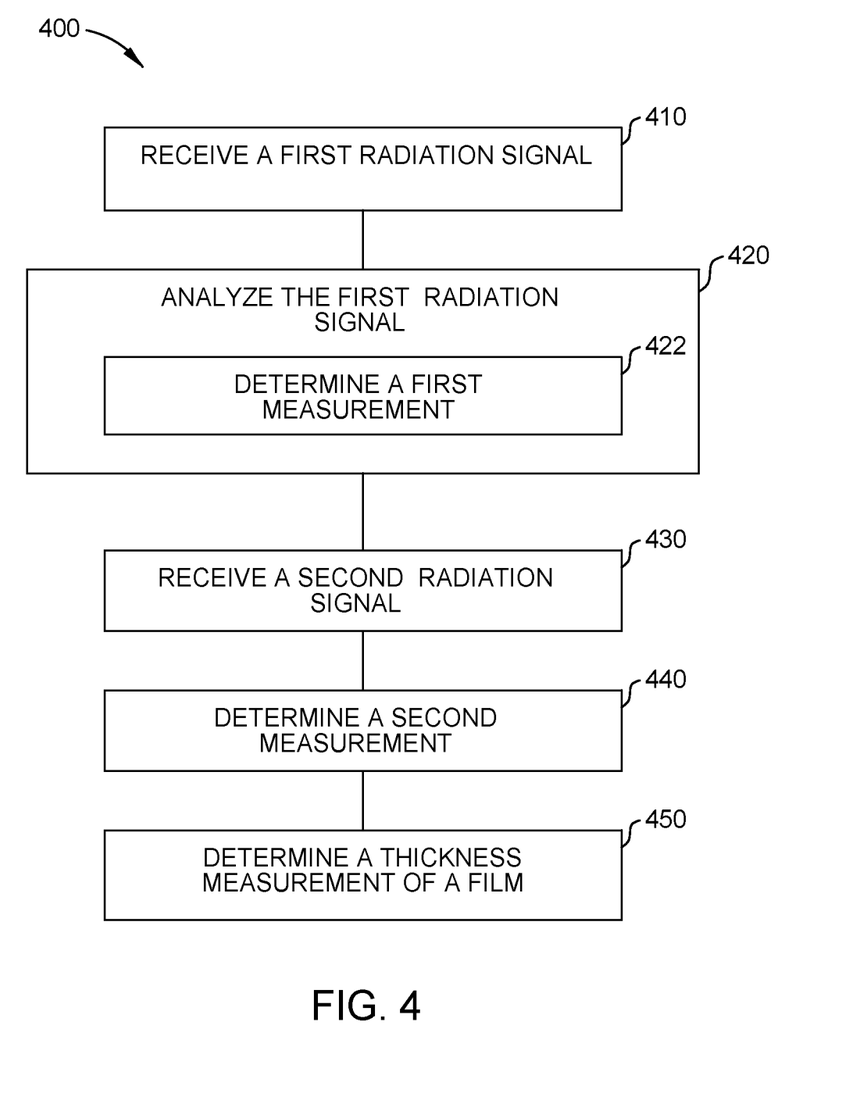
FIG. 4 illustrates a flow chart of a method of monitoring substrate processing, according to one or more embodiments.

FIG. 4 is a flowchart illustrating a method 400 for measuring the thickness of a film, according to one or more embodiments. At operation 410, a first radiation signal is received from a target element. For example, a first radiation signal may be received from the target element 310 by the sensing device 160. The first radiation signal comprises sensor data corresponding to a first state of the surface 315 of the target element 310 or the film 314 deposited on the surface 315 of the target element 310. For example, the first state of the surface 315 of the target element 310 is before deposition of a film occurs and no film is present on the surface 315. Further, the first state of the film 314 may correspond to a first period of the deposition of the film 314 onto the surface 315 or to a first period during the etching of the film 314. For example, the state of the film 314 may correspond to a state of the film 314 when at least a portion of the first film has been deposited onto or removed from the surface 315. The thickness of the film 314 may be similar to the thickness of the film 312 formed on the substrate 140. As such, monitoring the thickness of the film 314 allows for the monitoring of the film 312 disposed on the substrate 140.

At operation 420 the first radiation signal is analyzed. Analyzing the first radiation signal includes operation 422, determining a first measurement. For example, a first measurement may be determined for the film 314 or the surface 315 from the sensor data of the first radiation signal. The sensing device 160 may process the sensing data of the first radiation signal to determine the first measurement. Alternatively, the sensing device 160 may communicate the sensing data of the first radiation signal to the controller 130, and the controller 130 processes the sensing data to determine the first measurement.

At operation 430, a second radiation signal is received from the target element. For example, a second radiation signal is received from the target element 310. The second radiation signal may correspond to an increase in thickness of a film or a decrease in thickness of the film. The second radiation signal comprises sensor data corresponding to a second state of the film 314 on the surface 315 of the target element 310. For example, the second state of the film 314 may correspond to a second period during the deposition of the film 314 onto the surface 315 or a second period during the etching of the film 314. For example, the second state of the film 314 may correspond to a state of the film 314 when the thickness of the film 314 has either increased or decreased.

At operation 440, a second measurement is determined. For example, a second measurement may be determined for the film 314 from the sensor data of the second radiation signal. The sensing device 160 may process the sensing data of the second radiation signal to determine the second measurement. Alternatively, the sensing device 160 may communicate the sensing data of the second radiation signal to the controller 130, and the controller 130 processes the sensing data of the second radiation signal to determine the second measurement.

At operation 450, a thickness measurement of a film is determined. For example, a thickness measurement of the film 314 may be determined. The thickness measurement may be indicative of a change in thickness of a film. Alternatively, the thickness measurement may be indicative of a thickness measurement at a particular time during a deposition process or an etching process. The thickness measurement of the film 314 may be determined by comparing the first measurement with the second measurement. The sensing device 160 may compare the first measurement with the second measurement to determine the thickness measurement of the film 314. Alternatively, the controller 130 may compare the first measurement with the second measurement to determine the thickness measurement of the film 314.

After operation 450, the method of receiving radiation signals, determining corresponding measurements, and determining a corresponding thickness measurement of a film (e.g., the film 314) may be repeated to allow for continuous or semi-continuous monitoring of the thickness of the film. For example, the method of receiving radiation signals, determining corresponding measurements, and determining a corresponding thickness measurement of a film may be repeated to allow for continuous or semi-continuous monitoring of the thickness of the film as the thickness of film increases in response to a deposition process. Alternatively, the method of receiving radiation signals, determining corresponding measurements, and determining a corresponding thickness measurement of a film may be repeated to allow for continuous or semi-continuous monitoring of the thickness of the film as the thickness of film decreases in response to an etching process.

Figure 5:
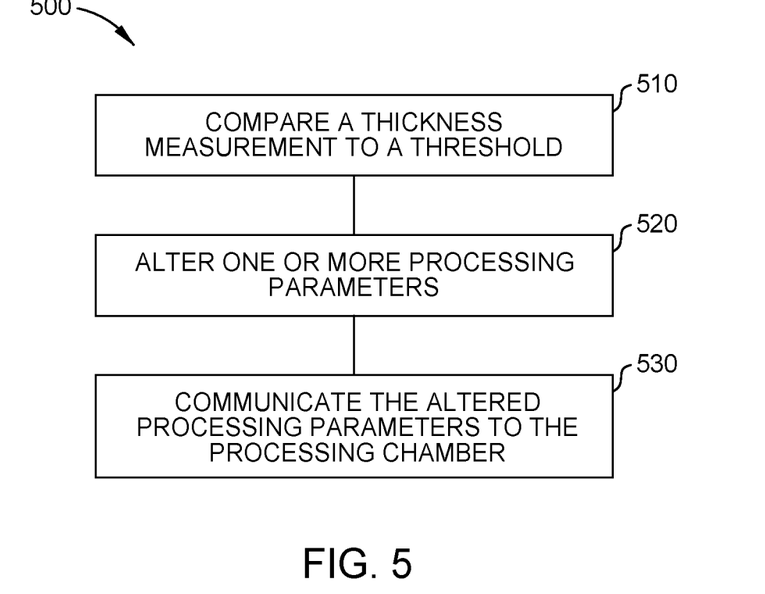
FIG. 5 illustrates a flow chart of a method of adjusting substrate processing, according to one or more embodiments.

FIG. 5 illustrates a flowchart of a method 500 for monitoring substrate processing within a processing chamber. At operation 510, a thickness measurement of a film is compared to one or more thresholds. For example, the thickness determined at operation 430 of the film 314 may be compared to one or more thresholds. The one or more thresholds may include an upper threshold and a lower threshold. The thresholds may correspond to the processing parameters utilized to process a substrate. The upper threshold may correspond to a maximum tolerance of a film thickness or change in thickness for a particular period during substrate processing and the lower threshold may correspond to a minimum tolerance for a film thickness or change in thickness for the particular period during substrate processing. Further, different thresholds may be used for different periods during the processing the substrate. Additionally, or alternatively, different thresholds may be used depending on the type of material being deposited or etched and/or the processing techniques utilized. Further, the controller 130 may compare the thickness measurement of the film 314 to the threshold.

At operation 520, determining to alter one or more processing parameters based on the comparison of the film thickness to the one or more thresholds. For example, the one or more of the processing temperature, processing pressure, type of processing gas, amount of processing gas, and processing (e.g., deposition or etch) time may be determined to be increased or decreased based on the on the comparison of the film thickness to the one or more thresholds. The controller 130 may determine to increase or decrease one or more of the processing temperature, processing pressure, amount of processing gas, and processing time in response to the film thickness measurement being less than a lower threshold or greater than an upper threshold.

At operation 530, the altered processing parameters are communicated to a process chamber. For example, the controller 130 may instruct the processing chamber 100 to increase or decrease one or more of the processing temperature, processing pressure, amount of processing gas, and processing time, and/or the type of processing gas while processing the substrate 140 based on the determination in operation 520.

Alternatively, the controller 130 may instruct the processing chamber 100 to increase or decrease one or more of the temperature, processing pressure, amount of processing gas, and processing time, and/or the type of processing gas for processing a next substrate. For example, the controller 130 may instruct the processing chamber 100 to increase or decrease one or more of the temperature, processing pressure, amount of processing gas, and processing time, and/or the type of processing gas for processing of additional substrates such that the film thickness is adjusted such or corresponds to a reference thickness value.

The reference thickness value may be simulated by modeling the deposition or etching process. Further, the reference thickness value may be determined by acquiring thickness measurement of one or more films during baseline substrate processing periods. The baseline substrate processing periods may be processing periods known to produce films free of artifacts. Alternatively, the reference thickness value may be determined by averaging the film thickness for films on two or more substrates.

Figure 6:
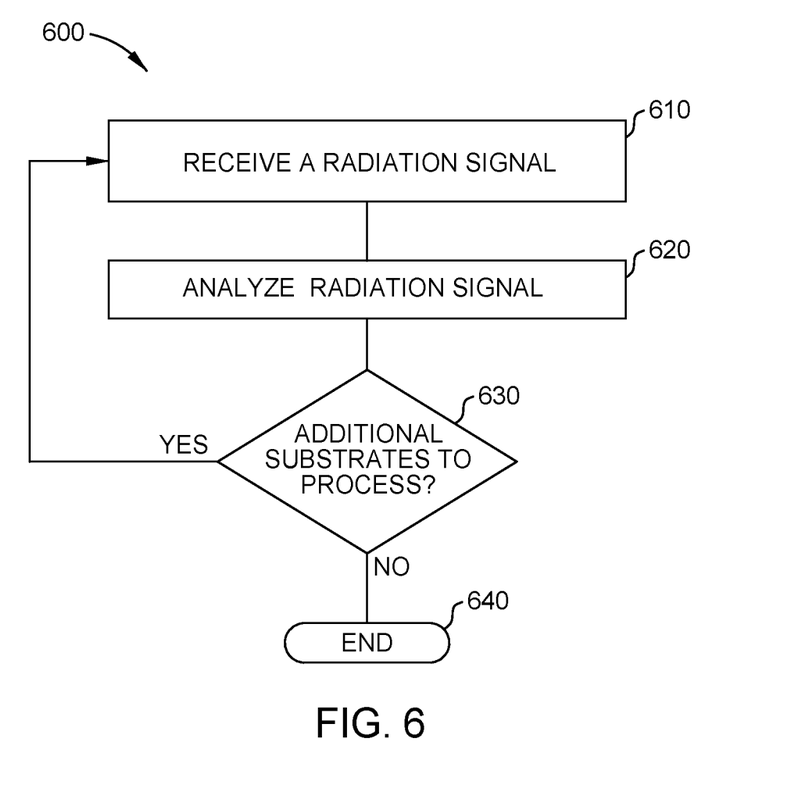
FIG. 6 illustrates a flow chart of a method for generating template waveforms, according to one or more embodiments.

FIG. 6 illustrates a flowchart of a method 600 for generating template waveforms, according to one or more embodiments. At operation 610, a radiation signal is received from a target element while a substrate (e.g., the substrate 140) is processed. The substrate 140 may be one of a plurality of substrates processed in a batch. Each substrate in the batch is assigned a batch number based on when it is processed within the batch. For example, a substrate having a batch number of 1 is the first substrate processed after a clean cycle, and a substrate having a batch number of N, where N is 2 or more may be the last substrate processed in a batch and before a clean cycle is completed.

A radiation signal is received from the target element 310 by the sensing device 160. The radiation signal comprises sensor data corresponding to a change in the thickness of a film deposited onto (or removed from) the surface 315 of the target element 310. The radiation signal is received while the substrate 140 is processed, such that the radiation signal is received from the beginning to end of processing the substrate 140.

At operation 620, the radiation signal is analyzed. For example, the radiation signal is analyzed to generate a corresponding signal waveform. Generating the signal waveform includes one or more of: collecting one or more data points from the received radiation signal, fitting an algebraic function (e.g., spline regression, step wise regression, smooth regression, or non-parametric regression, among others) to the data points, determining an area under the radiation signal, defining a delta from the beginning to end of substrate processing for each substrate, and determining a number of local extrema of the radiation signal. As the thickness of the film on the target element 310 changes over time, the generated signal waveform has a varying shape corresponding to the change in thickness of the film.

The signal waveform is stored within a memory (e.g., the memory 134) as a template waveform. The template waveform may be associated with an identifier within the memory 134. The identifier associates the template waveform with a substrate batch number. For example, a template waveform generated while a first substrate of a batch (e.g., batch number of 1) is processed is associated with a batch number of 1.

At operation 630, a determination whether not there are additional substrates with a batch to be processed is made. For example, a batch has N substrates which are processed before a clean process is completed for the processing chamber 100. N is 2 or more. If the batch number of the substrate for which processing has just been completed is less than N, operation 610 is completed for the next substrate and a signal waveform is generated and stored as a template waveform for the next substrate. The template waveform is stored with a corresponding batch number. If the number of the substrate for which processing has just been completed is equal to N, generating of template waveforms is ended (operation 640). In one embodiment, the method 600 includes the step of incrementing a counter before a subsequent radiation signal is received.

Figure 8:
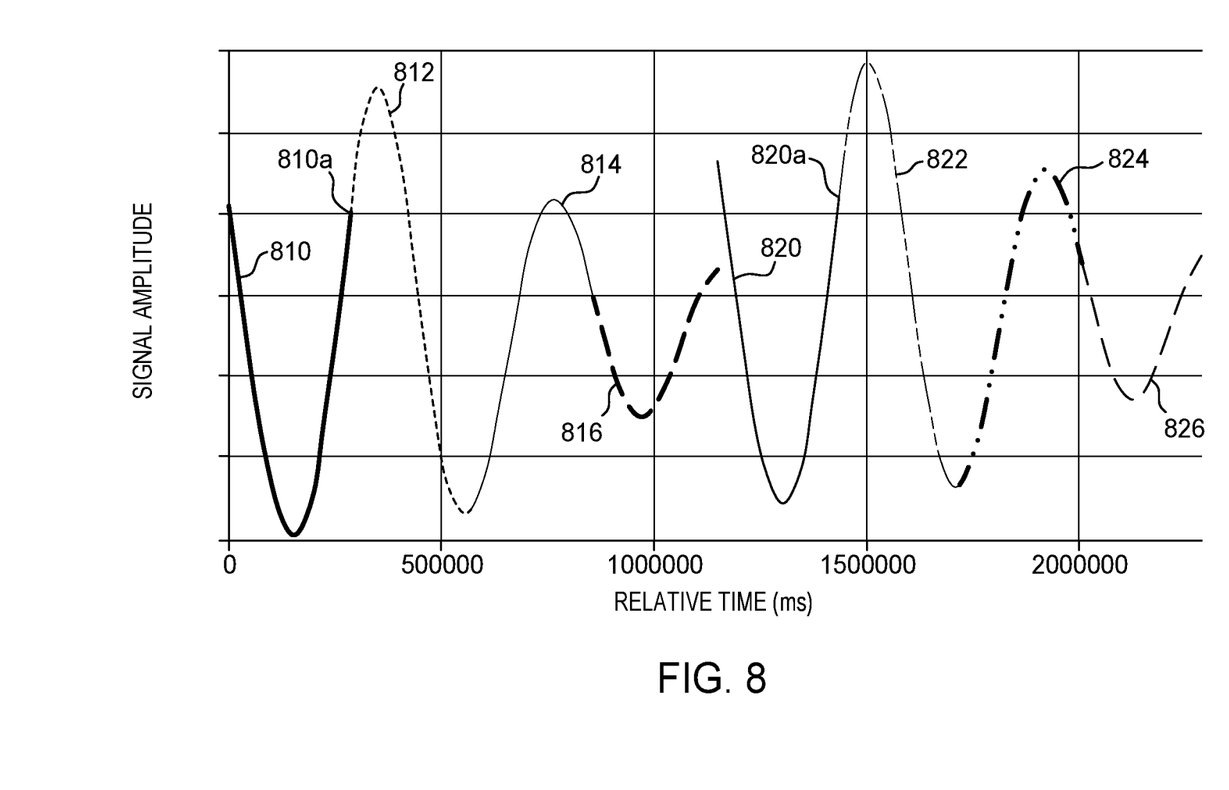
FIG. 8 illustrates various waveforms, according to one or more embodiments.

The operations 610 and 620 are repeated such that a corresponding waveform templates are generated for each substrate. FIG. 8 illustrates example template waveforms. For example, as illustrated in FIG. 8, the template waveforms 810-816 correspond to substrates having batch numbers 1-4, respectively. The template waveform 810 corresponds to a substrate having a batch number of 1, the template waveform 812 corresponds to a substrate having a batch number of 2, the template waveform 814 corresponds to a substrate having a batch number of 3, and the template waveform 816 corresponds to a substrate having a batch number of 4.

The method 600 may be initiated in response to a change in a process recipe and/or a change in a part within the process chamber to generate new template waveforms. For example, the method 600 may be completed in response to the susceptor 110 being replaced.

Figure 7:
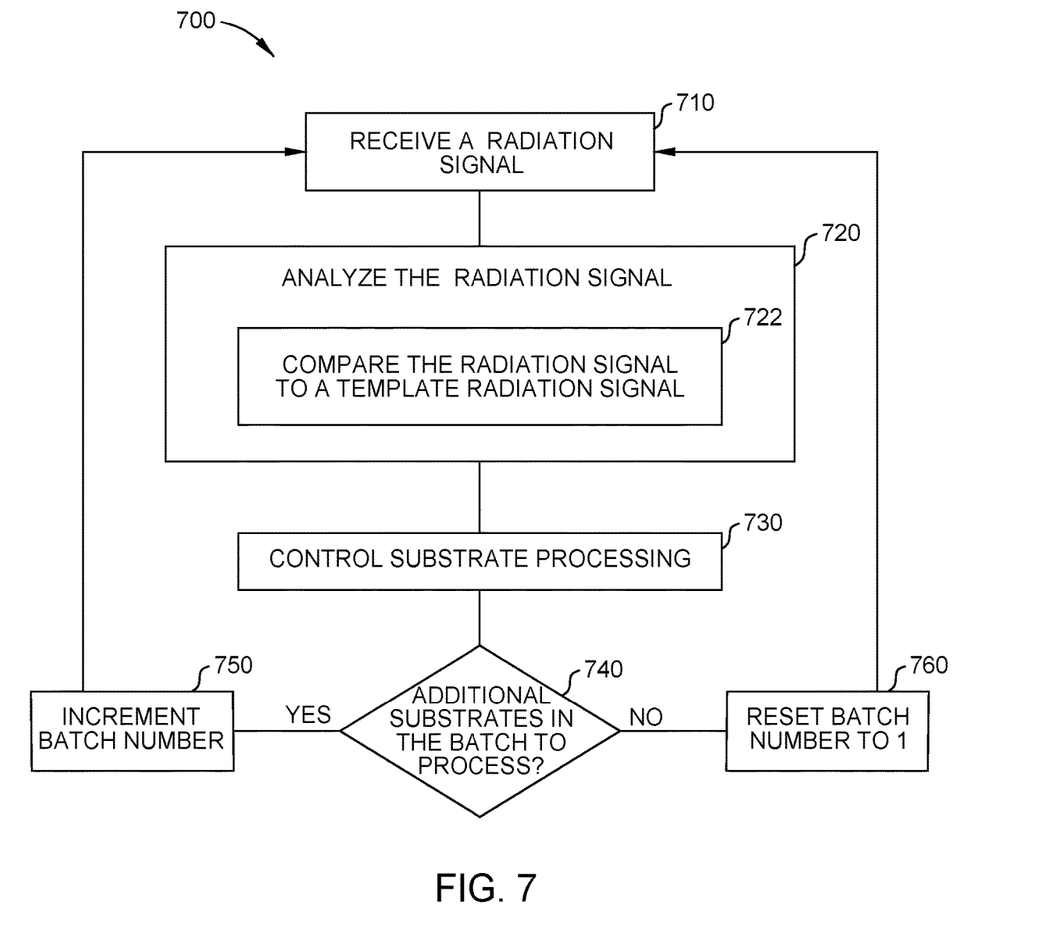
FIG. 7 illustrates a flow chart of a method for controlling processing of a substrate, according to one or more embodiments.

FIG. 7 illustrates a flowchart of a method 700 for controlling processing of one or more substrates, according to one or more embodiments. At operation 710 a radiation signal is received from a target element while a substrate is being processed. The first time operation 710 is completed i=1, where "i" is a substrate batch number. A radiation signal is received from the target element 310 by the sensing device 160. The radiation signal comprises sensor data corresponding to a change in the thickness of a film deposited onto (or removed from) the surface 315 of the target element 310.

The radiation signal is analyzed to generate a signal waveform as is described with regard to operation 620. An example signal waveforms are illustrated in FIG. 8 (e.g., signal waveforms 820-826). Each of the signal waveforms 820-826 corresponds to a different substrate processed within the process chamber 100.

At operation 720, the radiation signal is analyzed. For example, the operation 720 includes the operation 722, comparing the radiation signal to a template signal. Comparing the radiation signal to the template signal includes comparing the signal waveform generated from a radiation signal to the corresponding template signal. Substrates may be processed in a batch, and each substrate in the batch is assigned an associated batch number. A substrate having a batch number of 1 is the first substrate processed after a clean cycle, and a substrate having a batch number of N, where N is 2 or more may be the last substrate processed in a batch and before a clean cycle is completed. A signal waveform for a substrate having a batch number of 1 is compared against a template waveform associated with a batch number of 1. Further, a signal waveform for a substrate having a batch number of N is compared against a template waveform associated with a batch number of N. Accordingly, the signal waveform for each substrate is compared against a template waveform having the same batch number. With reference to FIG. 8, the signal waveform 820 is compared to the template waveform 810.

At operation 730, substrate processing is controlled. Substrate processing is controlled based on the comparison of the radiation signal to the template signal. For example, comparing the radiation signal to the template signal may identify when to stop processing the substrate such that the results from processing substrates having a same batch number from batch to batch is consistent. For example, as the template waveforms correspond to the starting point and ending point for processing of a corresponding substrate, when the shape radiation signal (or the signal waveform generated from the radiation signal) and matches the ending shape of the template waveform, an indication to processing of the substrate is stopped. For example, as illustrated in FIG. 8, the shape of signal waveform 820 is similar to the shape of template waveform 810. By comparing signal waveform 820 to the template waveform 810, when the signal waveform 820 reaches point 820*a*, which is associated with point 810*a* indicating the end of processing the substrate corresponding to template waveform 810, processing of the substrate corresponding to the signal waveform 820 is stopped. Accordingly, process uniformity may be increased between substrate batches as each substrate within a batch may be processed for a different time within the batch but substrates with a common substrate batch number are processed with a common amount of time from batch to batch.

Further, controlling substrate processing may identify when to initiate a clean process of the processing chamber. For example, if the radiation signal and the template signal differ by more than a threshold amount, a clean process is initiated. The threshold is about 5%. Alternatively, the threshold may be less than or greater than 5%. Additionally, or alternatively, controlling substrate processing may identify when a part of the process chamber should be replaced. For example, if the radiation signal and the template signal differ by more than a threshold amount, a determination that a part of the process chamber 100 is made. In one embodiment, the susceptor 110 may be identified as having a failure and should be replaced. Alternatively, in other embodiments, other parts of the process chamber 100 are identified as ready to be replaced.

At operation 740, a determination if there are additional substrates in a batch to process is made. For example, if the current batch number is less than N, where N is the last substrate in a batch, the batch number is incremented and operations 710-730 are repeated. If the current batch number is equal to N, the batch number is reset to 1, and operations 710-730 are repeated. This ensures that radiation signal received is associated with the current template waveform and processing of the substrates are correctly controlled.

In various embodiments, the operations of methods 400 and/or 500 are combined with the operations of methods 600 and 700. For example, the process of observing the thickness of a film being deposited and altering processing parameters of method 500 (operations 510-530 of FIG. 5) may be combined with the process of comparing the radiation signals to a template signal to control substrate processing of method 700 (operations 710-760).

As such, using the systems and methods discussed herein, through the introduction monitoring the deposition or etching of films, the uniformity of a film or films generated on a substrate may be increased. As such, the production yield of corresponding semiconductor devices may be increased and the manufacturing costs may be decreased.

While the foregoing is directed to embodiments of the present disclosure, other and further embodiments of the disclosure may be devised without departing from the basic scope thereof, and the scope thereof is determined by the claims that follow.

What is claimed is:

1. A method for processing a substrate within a processing chamber, the method comprising:
   receiving a first radiation signal corresponding to a first film on a surface of a chamber hardware component disposed within the processing chamber while processing the substrate;
   determining a thickness of a second film on the substrate while processing the substrate by analyzing the first radiation signal, wherein analyzing the first radiation signal comprises comparing the first radiation signal to a template waveform, the template waveform corresponding to a further radiation signal received while processing a second substrate in the processing chamber; and
   controlling the processing of the substrate based on the analyzed first radiation signal.

2. The method of claim 1 further comprising:
   receiving a second radiation signal corresponding to the first film on the surface of the chamber hardware component within the processing chamber, wherein analyzing the first radiation signal comprises:
      determining a thickness measurement of the first film based on the first radiation signal and the second radiation signal, and wherein controlling the processing of the substrate comprises:
         adjusting one or more processing parameters based on the thickness measurement of the first film.

3. The method of claim 2, further comprising:
   determining a first measurement based on the first radiation signal; and
   determining a second measurement based on the second radiation signal, wherein determining the thickness measurement of the first film is further based on a comparison of the first measurement and the second measurement.

4. The method of claim 2, further comprising comparing the thickness measurement of the first film to one or more thresholds, and wherein adjusting the one or more processing parameters comprises adjusting the one or more processing parameters based on the comparison of the thickness measurement of the first film to the one or more thresholds.

5. The method of claim 2, wherein the one or more processing parameters include one or more of a processing temperature, a processing pressure, an amount of processing gas, a type of processing gas, or a processing time.

6. The method of claim 1, wherein controlling processing of the substrate comprises stopping processing of the substrate based on the comparison of the first radiation signal to the template waveform.

7. A processing chamber comprising:
   a substrate support configured to support a substrate within a processing volume of the processing chamber;
   a first sensing device configured to receive a first radiation signal corresponding to a first film on a surface of a chamber hardware component disposed within the processing volume while processing the substrate; and
   a controller configured to:
      determine a thickness of a second film on the substrate by analyzing the first radiation signal during the processing of the substrate, wherein analyzing the first radiation signal comprises comparing the first radiation signal to a template waveform, the template waveform corresponding to a further radiation signal received while processing a second substrate in the processing chamber; and
      control the processing of the substrate based on the analyzed first radiation signal.

8. The processing chamber of claim 7, wherein the first sensing device is further configured to receive a second radiation signal corresponding to the first film on the surface of the chamber hardware component while processing the substrate, wherein the controller is further configured to determine a thickness measurement of the first film based on the first radiation signal and the second radiation signal, and wherein controlling the processing of the substrate comprises adjusting one or more processing parameters based on the thickness measurement of the first film.

9. The processing chamber of claim 8, wherein the controller is further configured to:
determine a first measurement based on the first radiation signal; and
determine a second measurement based on the second radiation signal, wherein determining the thickness measurement of the first film is further based on a comparison of the first measurement and the second measurement.

10. The processing chamber of claim 8, wherein the controller is further configured to compare the thickness measurement of the first film to one or more thresholds, and wherein adjusting the one or more processing parameters comprises adjusting the one or more processing parameters based on the comparison of the thickness measurement of the first film to the one or more thresholds.

11. The processing chamber of claim 8, wherein the one or more processing parameters include one or more of a processing temperature, a processing pressure, an amount of processing gas, a type of processing gas, or a processing time.

12. The processing chamber of claim 7, wherein controlling processing of the substrate comprises stopping processing of the substrate based on the comparison of the first radiation signal to the template waveform.

13. The processing chamber of claim 7, further comprising a lid, and wherein the first sensing device is mounted to the lid.

14. The processing chamber of claim 7, wherein the chamber hardware component is one of a portion of the substrate support or a portion of a liner of the processing chamber.

15. The processing chamber of claim 7, wherein the first sensing device is one of a radiation thermometer, an emissivity sensor, or a pyrometer.

16. A controller for a processing chamber, the controller configured to:
receive a first radiation signal with a sensing device while processing a substrate, the first radiation signal corresponding to a first film on a surface of a chamber hardware component disposed within the processing chamber;
determine a thickness of a second film on the substrate by analyzing the first radiation signal during the processing of the substrate, wherein analyzing the first radiation signal comprises comparing the first radiation signal to a template waveform, the template waveform corresponding to a further radiation signal received while processing a second substrate in the processing chamber; and
control the processing of the substrate based on the analyzed first radiation signal.

17. The controller of claim 16, wherein the controller is further configured to receive a second radiation signal corresponding to the first film on the surface of the chamber hardware component within the processing chamber, wherein analyzing the first radiation signal comprises:
determining a thickness measurement of the first film based on the first radiation signal and the second radiation signal, and wherein controlling the processing of the substrate comprises:
adjusting one or more processing parameters based on the thickness measurement of the first film.

18. The controller of claim 16, wherein the control of the processing of the substrate comprises stopping processing of the substrate based on the comparison of the first radiation signal to the template waveform.

* * * * *